US012560864B2

(12) United States Patent
Husemann et al.

(10) Patent No.: US 12,560,864 B2
(45) Date of Patent: Feb. 24, 2026

(54) METHOD FOR ASCERTAINING AN IMAGE OF AN OBJECT

(71) Applicant: Carl Zeiss SMT GmbH, Oberkochen (DE)

(72) Inventors: Christoph Husemann, Jena (DE); Dirk Seidel, Jena-Leutra (DE); Marco Mout, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 475 days.

(21) Appl. No.: 18/089,796

(22) Filed: Dec. 28, 2022

(65) Prior Publication Data

US 2023/0131390 A1     Apr. 27, 2023

Related U.S. Application Data

(63) Continuation of application No. PCT/EP2021/065644, filed on Jun. 10, 2021.

(30) Foreign Application Priority Data

Jun. 29, 2020    (DE) ......................... 102020208045.3

(51) Int. Cl.
*G03F 1/84*          (2012.01)
*G02B 27/09*         (2006.01)

(52) U.S. Cl.
CPC ........... *G03F 1/84* (2013.01); *G02B 27/0988* (2013.01)

(58) Field of Classification Search
CPC ........ G03F 1/84; G02B 27/0988; G02B 26/10
(Continued)

(56) References Cited

U.S. PATENT DOCUMENTS 11,079,338 B2 *   8/2021   Matejka ............. G01B 9/02083
2001/0019625 A1    9/2001   Kenan et al.
(Continued)

FOREIGN PATENT DOCUMENTS

CN       101512309 A     8/2009
CN       110631503 A     12/2019
(Continued)

OTHER PUBLICATIONS

The Office Action issued by the German Patent Office for Application No. DE 10 2020 208 045.3, Dated Jan. 27, 2021 (with English Translation).
(Continued)

*Primary Examiner* — Caleen O Sullivan
(74) *Attorney, Agent, or Firm* — Fish & Richardson P.C.

(57)          ABSTRACT

To ascertain an image of an object which emerges when the object is illuminated with illumination light from a partly coherent light source with a target illumination setting having an illumination-side numerical aperture NA_illu and an imaging-side numerical aperture NA_detection, the following procedure is performed: initially, a section of the object is illuminated with illumination light from a coherent measurement light source with an illumination setting having an illumination-side numerical aperture NA_i, which is at least as large as NA_detection. Then, a diffraction image of the illuminated section is recorded. This is implemented by way of a spatially resolved detection in a far field detection plane of a diffraction intensity of illumination light diffracted by the illuminated section with a recording-side numerical aperture NA by way of a plurality of sensor pixels. This recording-side aperture must be greater than or equal to the maximum of NA_illu and NA_detection. From the recorded diffraction image data, the image of the section of the object for the target illumination setting is then
(Continued)

ascertained from the recorded diffraction image data. An apparatus for carrying out the method comprises a measurement light source for providing the illumination light and a spatially resolving detector, arranged in the detection plane, for recording the diffraction image. This yields a method and an apparatus by means of which a flexible image ascertainment of sections of the object is facilitated, in particular for different target illumination settings.

20 Claims, 3 Drawing Sheets

(58) Field of Classification Search
USPC ........................................................ 430/5, 1
See application file for complete search history.

(56) References Cited

U.S. PATENT DOCUMENTS

| | | | |
|---|---|---|---|
| 2012/0162755 | A1 | 6/2012 | Stroessner et al. |
| 2013/0141707 | A1 | 6/2013 | Baer et al. |
| 2013/0335552 | A1 | 12/2013 | Feldmann et al. |
| 2017/0059845 | A1 | 3/2017 | Waller et al. |
| 2017/0132782 | A1 | 5/2017 | Matejka et al. |
| 2019/0391087 | A1 | 12/2019 | Matejka et al. |

FOREIGN PATENT DOCUMENTS

| | | |
|---|---|---|
| CN | 111272094 A | 6/2020 |
| DE | 102015106806 A1 | 11/2016 |
| DE | 102018210315 | 1/2020 |
| KR | 1020200000818 | 1/2020 |
| TW | 201035516 A | 10/2010 |
| TW | 201229674 | 7/2012 |
| WO | WO 2016/012426 | 1/2016 |

OTHER PUBLICATIONS

The International Search Report for International Application No. PCT/EP2021/065644, dated Oct. 8, 2021.

Faulkner et al. "Movable Aperture Lensless Transmission Microscopy: A Novel Phase Retrieval Algorithm", *Physical Review Letters*, vol. 93, No. 2, pp. 023903-1-023903-4 (Jul. 2004).

Gardner et al. "High numerical aperture reflection mode coherent diffraction microscopy using off-axis apertured illumination", *Optics Express*, vol. 20, No. 17, pp. 19050-19059 (Aug. 13, 2012).

Maiden et al. "Further improvements to the ptychographical iterative engine", *Optica*, vol. 4, No. 7, pp. 736-745 (Jul. 2017).

Potier et al., "Experimental comparison of full and partial coherent illumination in coherent diffraction imaging reconstructions", *Journal of Physics*, Conference Series 425, 192009—(Mar. 22, 2013).

Wojdyla et al., "EUV photolithography mask inspection using Fourier ptychography", *Proceedings of SPIE*, vol. 10656, pp. 106560W-1-106560W-8 (2018).

Zhang et al., "Full field tabletop EUV coherent diffractive imaging in a transmission geometry", *Optics Express*, vol. 21, No. 19, pp. 21970-21980 (Sep. 23, 2013).

Zhang et al., "Quantitative tabletop coherent diffraction imaging microscope for EUV lithography mask inspection", *Proceedings of SPIE*, vol. 9050, pp. 90501D-1-90501D-9 (Apr. 2, 2014).

Zhang et al., "Translation position determination in ptychographic coherent diffraction imaging", *Optics Express*, vol. 21, No. 11, pp. 13592-13606 (Jun. 3, 2013).

Kirchauer, "Photolithography Simulation", PhD Thesis, Institute for Microelectronics, TU Vienna (Apr. 17, 1998).

The Office Action issued by the Korean Patent Office for Application No. KR 10-2023-7002182, dated Jan. 17, 2025 (with English Translation).

The Office Action and Search Report issued by the Taiwan Patent Office for Application No. TW 110121044, dated Feb. 13, 2025 (with English Translation).

Office Action and Search Report in Chinese Appln. No. 202180046817.0, mailed on Nov. 7, 2025, 22 pages (with English Translation).

* cited by examiner

1

METHOD FOR ASCERTAINING AN IMAGE OF AN OBJECT

CROSS-REFERENCE TO RELATED APPLICATIONS

This application is a continuation of and claims priority under 35 U.S.C. § 120 from PCT Application No. PCT/EP2021/065644, filed on Jun. 10, 2021, which claims priority from German patent application DE 10 2020 208 045.3, filed on Jun. 29, 2020. The entire contents of each of these priority applications are incorporated herein by reference.

TECHNICAL FIELD

The invention relates to a method for ascertaining an image of an object. Further, the invention relates to an apparatus for carrying out the method.

BACKGROUND

A method and respectively an apparatus for detecting a structure of a lithography mask are known from WO 2016/012426 A1. In the latter a 3D aerial image measurement takes place in the region around an image plane during the imaging of a lithography mask arranged in an object plane.

The specialist article "Quantitative tabletop coherent diffraction imaging microscope for EUV lithography mask inspection" by B. Zhang, et al., proceedings of SPIE 9050, Metrology, Inspection, and Process Control for Microlithography XXVIII, 90501D (Apr. 2, 2014) discloses a structure detection method for the inspection of lithography masks. The specialist article "Translation position determination in ptychographic coherent diffraction imaging" by F. Zhang et al., Optics Express, Vol. 21, No. 11, 2013 discloses a position estimation method using ptychography. The specialist article "EUV photolithography mask inspection using Fourier ptychography" by A. Wojdyla, proceedings SPIE 10656, Image Sensing Technologies: Materials, Devices, Systems, and Applications V, 106560W (May 29, 2018) discloses an apparatus for inspecting EUV lithography masks using Fourier ptychography.

SUMMARY

It is an aspect of the present invention to develop a method and an apparatus of the type set forth at the outset, in such a way that a flexible image ascertainment of sections of the aspect, in particular for different target illumination settings, is made possible.

In respect of the method, the aspect is achieved according to the invention by a method having the features specified in claim 1.

The invention has recognized that method steps known firstly from coherent diffractive imaging (CDI) and secondly from microscopic spot imaging can be combined with one another in such a way that a diffraction image of an extended object section illuminated with a defined illumination-side numerical aperture is detected and the diffraction image data can be used to simulate, in particular, a different illumination situation of the illuminated object section and, more particularly, a selected target illumination setting. Thus, when carrying out the ascertainment method, it is not necessary for the object to be actually illuminated with the target illumination setting; instead, it is enough if the object is illuminated using a different illumination setting, more particularly an illumination setting that is easier to generate, of the coherent measurement light source.

The target illumination setting can be a used illumination setting, utilized within the scope of projection lithography. In particular, it is possible to ensure an image ascertainment for various target illumination settings, the only precondition of which being that a numerical aperture of the respective target illumination setting is at most as large as the numerical aperture of the measurement illumination. A coherent CDI measurement of the object allows, in particular, to predict images which would arise when the object is illuminated using a partially coherent illumination setting.

In addition to the combined use of CDI and microscopic spot imaging, it is also possible, in principle, within the scope of the ascertainment method to carry out the simulation with the aid of artificial intelligence processes (machine learning) and convolution/deconvolution algorithms, particularly in conjunction with the processing of the diffraction image data.

In this case, the term numerical aperture (NA) is used synonymously with an illumination-side or imaging-side stop, which restricts the angle spectrum of the light in a plane that is conjugated to the object.

In the method according to claim 2, it is possible to use ptychography algorithms which are described in the specialist article by A. Maiden et al., OPTICA, Vol. 4, No. 7, 2017 and "Movable Aperture Lensless Transmission Microscopy: A Novel Phase Retrieval Algorithm" by H. M. L. Faulkner et al., Phys. Rev. Lett., Vol. 93, No. 2, 2004. The object illumination light field $\psi$ can be reconstructed for frequencies up to an aperture of the sum of the illumination-side aperture NA_i and the imaging-side aperture NA of the CDI structure, since all these frequencies contribute to the sensor signal. In the image ascertainment, it is the object illumination light field or the object exposure field that is reconstructed, and hence not the object itself. This optical field is reconstructed following an interaction with the object, i.e., for example, following a passage through the object. On account of the interaction with the object, the reconstructed field contains the complete structure information. Therefore, the object illumination light field is observed spatially downstream of the object section in order to take account of the interaction with the object section. A distance between, for example, a plane in which amplitude and phase of the object exposure field are reconstructed and an arrangement plane of the object section can be 0. This distance can also be greater than 0.

The method according to claim 3 renders insights from scanning microscopy usable, which insights are known, for example, from US 2013/0335552 A.

This applies accordingly to the simulation method according to claim 4.

Precise aerial image data arise in the simulation according to claim 5.

The advantages of an apparatus according to claim 6 correspond to those which have already been explained above with reference to the image ascertainment method. The apparatus can be used as a measurement system for mask qualification or else as a registration tool.

An aperture stop according to claim 7 increases the variability of the measurement apparatus. In particular, it is possible to specify a maximum numerical aperture of the illumination.

BRIEF DESCRIPTION OF DRAWINGS

Exemplary embodiments of the invention are explained in greater detail below with reference to the drawings. In said drawings.

DETAILED DESCRIPTION

Figure 1:
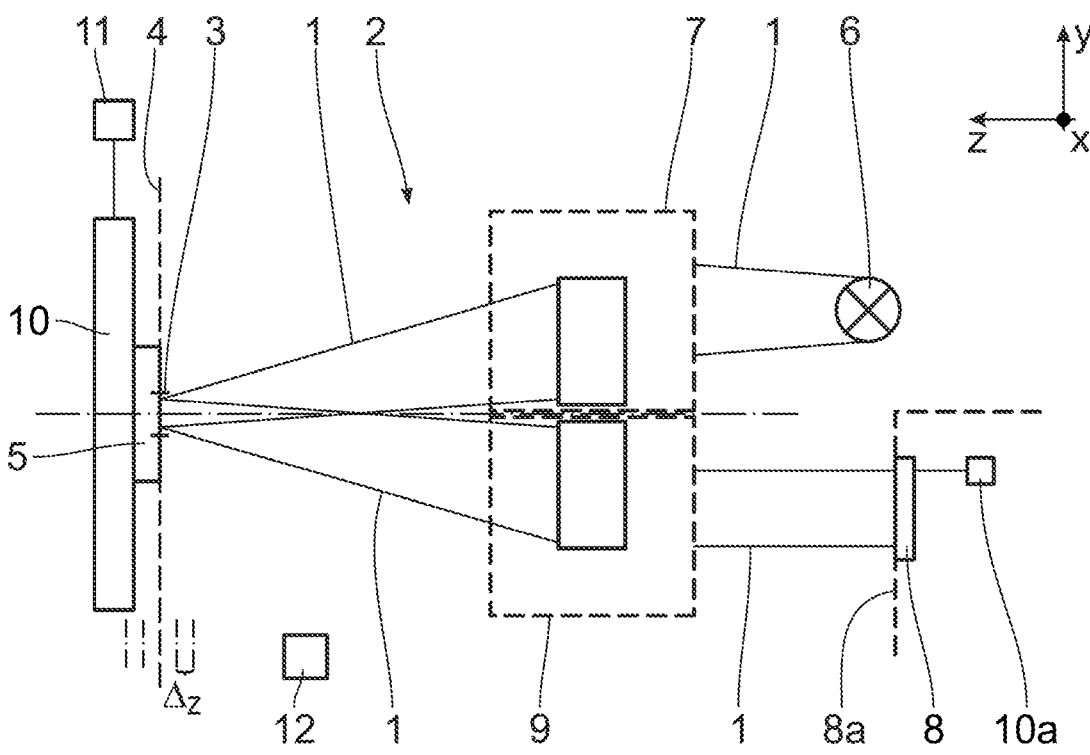
FIG. 1 shows highly schematically, in a plan view with the viewing direction perpendicular to a plane of incidence, a measurement system for detecting a structure of a lithography mask by detection of at least one diffraction image, for measuring a reflective lithography mask.

FIG. 1 shows in a view corresponding to a meridional section a beam path of EUV illumination light and imaging light 1 in a metrology system 2 for the examination of an object 5, arranged in an object field 3 in an object plane 4, in the form of a reticle or a lithography mask or a section thereof with the EUV illumination light 1.

The metrology system 2 is used as an apparatus for analysis of a diffraction image and serves to detect a structure of the lithography mask, which is in turn used during EUV projection exposure for the production of semiconductor components. The mask structure detected by the metrology system 2 can then be used for example to determine effects of properties of the lithography mask on the optical imaging by projection optical units within a projection exposure apparatus.

The metrology system 2, in a similar manner to the system known from WO 2016/012426 A1, can be a system for mask qualification. In this case, the structure to be detected of the lithography mask 5 is the mask structure to be imaged itself.

As an alternative or in addition thereto, the structure to be detected of the lithography mask 5 can be a position marker or a used structure on the lithography mask 5. The detection of such a position marker or a used structure can be used to detect or to measure an exact position of a plurality of position markers with respect to one another or of a plurality of used structures with respect to one another or used structure(s) relative to position marker(s) on the lithography mask 5. The metrology system 2 then finds application as a registration tool. One registration tool is known under the tradename PROVE. The measurement wavelength of the illumination light 1 can correspond to an actual projection exposure wavelength.

In order to facilitate the presentation of positional relationships, a Cartesian xyz-coordinate system is used hereinafter. The x-axis extends perpendicular to the plane of the drawing and out of the latter in FIG. 1. The y-axis extends upward in FIG. 1. The z-axis extends to the left in FIG. 1.

The object plane 4 is parallel to the xy-plane.

The illumination light 1 is reflected and diffracted at the object 5. A plane of incidence of the illumination light 1 lies parallel to the yz-plane.

Depending on the embodiment of the metrology system 2, the latter can be used for a reflective or for a transmissive object 5. One example of a transmissive object is a phase mask.

The EUV illumination light 1 is generated by a measurement light source 6. This can be a light source in the visible range, in the near, middle or far UV range or in the EUV range. The light source 6 can be a laser plasma source (LPP; laser produced plasma) or a discharge source (DPP; discharge produced plasma). It is also possible to use a synchrotron-based light source, or a Free Electron Laser (FEL). The light source 6 can comprise a device for generating high harmonics of a fundamental wavelength (High Harmonic Generation, HHG). A used wavelength of the EUV light source can be, e.g., in the range of between 5 nm and 30 nm. However, longer or shorter wavelengths are also possible. In principle, in the case of a variant of the metrology system 2, a light source for another used light wavelength can also be used instead of the light source 6, for example a light source for a DUV used wavelength of 193 nm. The light source 6 is a coherent light source.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle or a defined illumination angle distribution with which the field points of the object field 3 are illuminated. With the lithography mask 5 arranged in the object field 3, the object field 3 simultaneously constitutes an illuminated portion of the lithography mask 5.

The object field 3 is illuminated in the metrology system 2 in such a way that a part of the object 5 is illuminated in each case by way of a macroscopic spot of the illumination light 1. The spot can have a diameter of several micrometers. By way of example, this diameter can range between 2 μm and 30 μm. This spot of the illumination light 1 is scanned laterally over the entire object field 3. During this scanning procedure, the spots of the illumination light 1 overlap at adjacent scanning points. A diffraction image is recorded at each scanning point, i.e., at each current position of the spot of the illumination light 1 on the object field 3, as will be explained in more detail below.

After reflection at the object 5 or transmission through the object 5, the diffracted illumination or imaging light 1 impinges on a spatially resolving detection unit or detection device 8 of the metrology system 2. Thus, a diffraction measurement occurs, which is also referred to as CDI (coherent diffractive imaging) below. The detection device 8 is embodied as CCD or CMOS detector, for example, and comprises a plurality of sensor pixels, which are arranged in rows and columns in the form of an array and which are not illustrated in any more detail in the drawing. A spatial resolution of the sensor or detector arises by way of a corresponding pixel division. The spatially resolving sensor of the detection device 8 can be delimited in a square or rectangular fashion. The CCD or CMOS detector is arranged in a detection plane 8a. The detection device 8 detects a diffraction intensity during the recording of the diffraction image of the lithography mask 5. As indicated in FIG. 1, a deflecting and/or beam-influencing optical unit 9 can be arranged between the object 5 and the detection device 8. This is not mandatory, however. In other words, it is also possible for no optical element and/or no beam-influencing element at all to be arranged between the object 5 and the detection device 8.

The detection device 8 is signal connected to a digital image processing device 10a.

The object 5 is carried by a mask or object holder 10. The latter can be displaced by way of a displacement drive 11 on the one hand parallel to the xy-plane and on the other hand perpendicularly to this plane, that is to say in the z-direction, e.g., in $\Delta_z$ increments. The mask holder 10 is displaceable for changing between portions to be illuminated of the lithography mask 5. The mask holder 10 can additionally be embodied as tiltable about the x-axis and/or about the y-axis. The displacement drive 11, as also the entire operation of the metrology system 2, is controlled by a central control device 12, which, in a way that is not illustrated in more specific detail, is signal connected to the components to be controlled.

Figure 2:
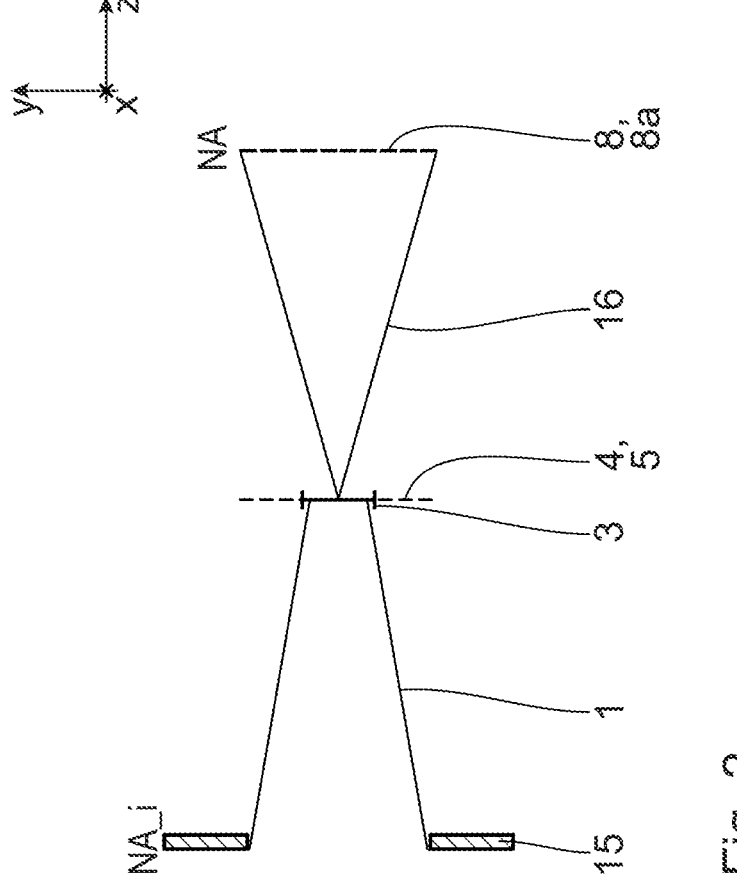
FIG. 2 shows schematically and for elucidation in relation to a transparent object, a measurement arrangement of the measurement system which is illuminating a section of the lithography mask, as object to be measured, using illumination light of a partly coherent measurement light source with an illumination-side numerical aperture and with a recording-side or detection-side numerical aperture for recording a diffraction image of the illuminated object section.

FIG. 2 elucidates the aperture ratios, firstly when illuminating the lithography mask 5 with the illumination light 1 and secondly when detecting the illumination light 1 diffracted by the lithography mask 5. Once again, the case of a reflective lithography mask 5 is illustrated. The illustration of FIG. 2 is not true to scale in respect of the shown numerical apertures or aperture angles.

The illumination light 1 impinges on the object field 3 with a chief ray angle CRA between an illumination-side chief ray CRAO and a normal N to the object plane 4 of 6°. The object field 3 arises as illumination spot of the illumination light 1.

A different chief ray angle CRA in the range between 3° and 8° is also possible, in particular. Proceeding from the object field 3, a zero order of diffraction of the illumination light 1 propagates with an image-side chief ray angle between an image-side chief ray CRAI and the normal N, which in turn has the value of the incidence-side chief ray angle CRA.

FIG. 2 shows illumination parameters of a measurement arrangement which is realized by the metrology system 2. The object 5 in the object plane 4 is illustrated as a transparent object that transmits illumination light 1 in FIG. 2. An example of such a transparent object 5 is a lithography mask in the form of a transmissive phase mask. At the same time, the illustration of FIG. 2 serves for a better elucidation on account of the better separation of the illumination light side from the detection side in comparison with the illustration of FIG. 1 with the reflective object 5.

In the measurement structure according to FIG. 2, the object 5 is illuminated with an illumination-side numerical aperture NA_i. A section of the object 5 in the form of the object field 3 extending in the xy-plane is illuminated.

The illumination-side numerical aperture NA_i is specified by an illumination-side aperture stop 15.

A diffraction image of the object field 3 is recorded by the detector 8 in the detection plane 8a, the detector possibly being a CMOS or a CCD pixel array. This is implemented by spatially resolved detection of a diffraction intensity of the diffraction light 16, i.e., the illumination light 1 diffracted by the illuminated object field 3. This spatially resolved detection is implemented by the detection device 8 in the detection plane 8a, which represents a far field detection plane. This detection-site detection of the illumination light 16 is implemented with a recording-side numerical aperture NA.

In FIG. 2, the recording-side numerical aperture NA is illustrated in exemplary fashion for the diffraction light 16 emanating from an object point. In fact, the detection device 8 records the diffraction light 16 emanating from the entire object field 3.

A partly coherent image of the section of the object 5 arranged in the object field 3 can be ascertained from the diffraction image data recorded by the detection device 8. In this case, it is possible to specify the target illumination setting NA_illu and detection illumination setting NA_detection used to illuminate and detect the ascertained image in the simulation to be ascertained. In this case, NA_illu represents a parameter that is relevant to the target illumination setting, specifically the maximum numerical aperture thereof (maximum radius of a pupil of the target illumination setting in an illumination pupil plane). Additionally, the target illumination setting can satisfy further parameters, which yield defined full illumination of an illumination pupil plane. By way of example, for the target illumination setting, use can be made of a used illumination setting from projection lithography, known from the prior art.

Figure 3:
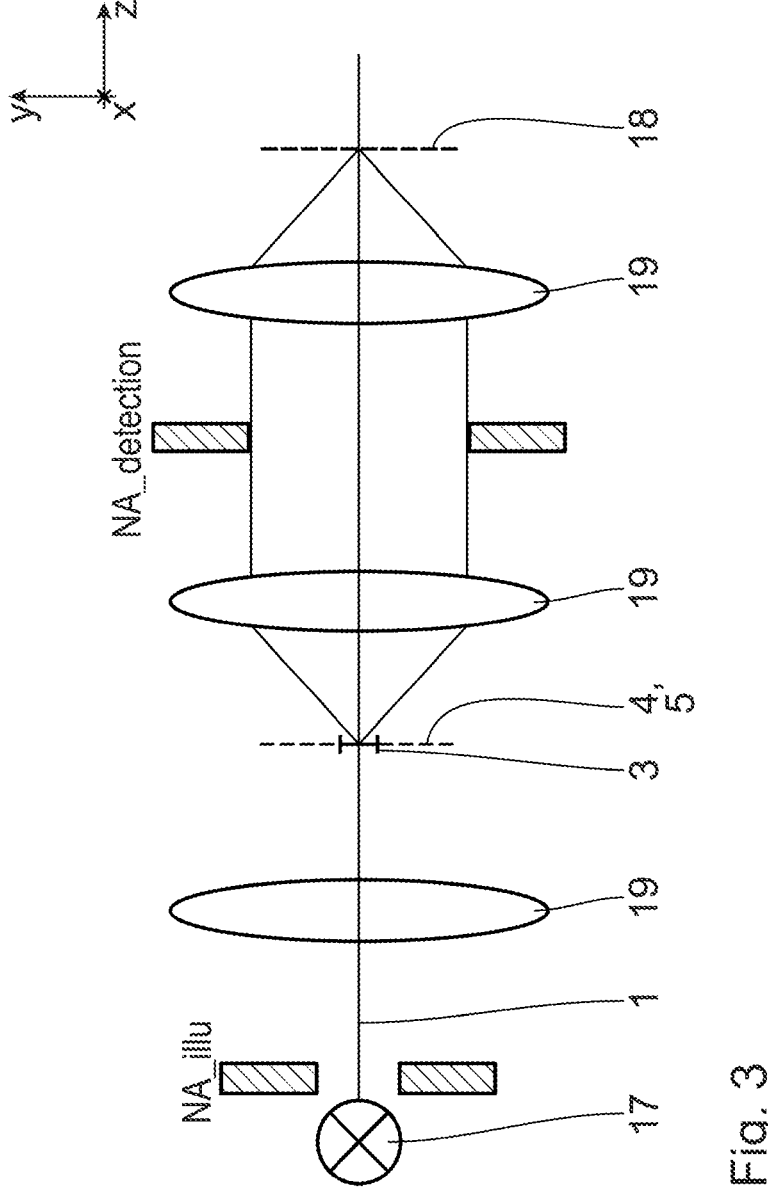
FIG. 3 shows, schematically and in a manner similar to FIG. 2, a configuration for elucidating aperture data when ascertaining an image of the object section for a target illumination setting in the form of a simulation scenario with an illumination-side numerical aperture and a likewise chosen detection-side numerical aperture from the diffraction image recording data recorded with the measurement arrangement according to FIG. 2.

FIG. 3 shows, in exemplary fashion, a variant of an illumination and detection situation as a simulation scenario, for which the simulated recorded image can be ascertained from the ascertained diffraction image data. In the simulation scenario according to FIG. 3, an illumination-side numerical aperture NA_illu of a simulation illumination with a simulation light source 17 is specified, the latter illuminating the object 5 in the simulation object plane 4. Moreover, FIG. 3 illustrates the specification of a numerical detection aperture NA_detection to be simulated. Then, the result of the ascertainment is a light intensity in a simulation image plane 18. FIG. 3 additionally schematically illustrates three lens elements 19 for elucidating the two numerical apertures NA_illu and NA_detection. The three lens elements 19 are a condenser lens element, which is arranged between the illumination-side numerical aperture NA_illu and the object field 3 in FIG. 3, and two objective lens elements or tube lens elements, which image the object field 3 into the simulation image plane 18.

The following procedure is carried out to ascertain an image of the object section in the object field 3, which is illuminated and detected like in the simulation scenario with the illumination-side numerical aperture NA_illu (target illumination setting) and the detection-side numerical aperture NA_detection:

Initially, the object section on the object field 3 is coherently illuminated with the illumination light 1 and the illumination side numerical aperture NA_i using the measurement structure according to FIG. 2 and all frequencies less than the image-side aperture NA are recorded by the detection unit 8, i.e., on a pixelated sensor in the far field. This maximum recorded frequency is defined to be the imaging-side aperture NA even though no physical stop needs to be present in the CDI measurement system; instead, the maximum recorded frequency may also arise from the lateral extent of the sensor.

What holds true as a matter of principle is that this imaging aperture NA is greater than or equal to the largest aperture value of the two numerical apertures NA_illu and NA_detection to be simulated. It thus holds true that:

$$NA \geq \max(NA\_detection, NA\_illu).$$

What must furthermore hold true is that the illumination-side aperture NA_i is greater than or equal to the aperture NA_detection to be simulated, i.e., the following holds true:

$$NA\_i \geq NA\_detection.$$

The aperture stop 15 determines the coherent illumination field for the running CDI measurement. In principle, it is possible to illuminate the object 5 with a comparatively simple illumination field. The selection of the target illumination setting to be simulated, which is then considered during the computational image ascertainment, is independent thereof.

In particular, the aperture stop 15 can be configured with adjustable components, for example in the style of an iris diaphragm or else in the style of a revolver interchanger, by means of which different interchangeable aperture stops, which can each be used to specify a certain illumination, can be inserted into a beam path of the illumination light 1. A corresponding interchanger can be motor driven and can be controlled by way of the central control device 12.

Köhler illumination or else a critical illumination can be used as a target illumination of the object field used for the image to be ascertained.

The intensity of the simulated image, i.e., of the object image to be ascertained, when illuminated by the target illumination setting can be written as follows:

$$I(x) = \int dk \alpha_i(k) |\int dp \hat{\psi}(p+k) P(p) e^{ipx}|^2 \qquad (1)$$

In this case:

I(x) is the arising light intensity in the illumination to be ascertained with the target illumination setting; x is an image field dimension in the detection plane 8a (correspondingly also y, x and y span the detection plane 8a);

k is the illumination direction of the illumination light 1 (wave vector);

$\alpha_1$ is the target illumination setting to be simulated;

p is the detection direction for recording the diffraction light 16 (wave vector);

$\hat{\psi}$ is the Fourier transform of the object section in the object field 3;

P is the detection aperture NA_detection.

Formula (1) allows the image to be emulated to be simulated with the target illumination setting if the object structure in the illuminated object section $\psi(x)$ is known. As a matter of principle, the latter can be directly calculated using known reconstruction algorithms, which are known under the heading CDI (coherent diffraction imaging).

An alternative method, which has greater stability in comparison with the ascertainment method explained above, is described below. Initially, a propagation signal $S_{xs}$ is calculated in an intermediate step as a function of the propagation direction k, which emanates from a spot at the location $x_s$ of the illuminated object section on the object field 3. Here it holds true that:

$$S_{xs}(k) = |\int d^2 x \psi(x) F_{xs}(x) e^{-ikx}|^2 \qquad (2)$$

Here, $F_{xs}$ is a function reproducing the selected spot (for a punctiform spot made of one pixel, $F_{xs}=1$ in the case of $x=x_s$; otherwise 0).

The signal $S_{xs}$ is described as measurement variable in US 2013/0335552 A1. Depending on the size of the illumination field in the CDI measurement setup, the matrix $S_{xs}$ is similar to the CDI sensor signal. Both are identical if the CDI illumination field equals $F_{xs}$. If the CDI illumination field has a greater extent (as is conventional), there needs to be a conversion, for example once again by way of the reconstructed illuminated object section $\psi(x)$ from a CDI reconstruction. The similarity of $S_{xs}$ to the CDI sensor signal is the reason for the greater stability of the second proposed method.

The image intensity to be simulated or to be ascertained in the simulation scenario according to FIG. 3 can now be calculated directly from the signal $S_{xs}$. Here, use is once again made of the intermediate step of calculating the image intensity at a location $x_s$ which corresponds to the location of the spot position, as addressed above in conjunction with Formula (2). The following holds true for the image intensity $I(x_s)$ to be ascertained at the location $x_s$:

$$I(x_s) = \int dk \alpha_1(k) S_{xs}(k) \qquad (3)$$

In this case, $\alpha_1$ is the target illumination setting to be simulated (within the numerical aperture NA_illu: 1 where there is illumination in the pupil plane in the case of the target illumination setting; 0 otherwise).

The calculation steps as per Formulas (2) and (3) are then carried out for all array positions $x_s=(x_i, y_i)$ of the sensor pixels of an image sensor to be simulated in the simulation image plane 18. Then, the result is an image intensity I(x, y) to be ascertained of the partly coherent image to be ascertained of the section of the object 5, which corresponds to the object field 3.

Such a reconstruction can also be carried out by use of a ptychography method. In this case, it is also possible to use iterative Fourier transform algorithms (IFTAs).

In this case, the coherent object illumination light field $\psi$ is reconstructed from the recorded diffraction image data immediately after the considered section 3 of the object 5, wherein the illumination field $\psi$ considered is that which would result when the object 5 is illuminated with illumination light in the form of a plane wave.

By way of example, the object structure $\psi(x)$ is reconstructed using a method from coherent diffractive imaging (CDI). Such a method is known from the specialist article "High numerical aperture reflection mode coherent diffraction microscopy using off-axis apertured illumination" by D. F. Gardner et al., Optics Express, Vol. 20, No. 17, 2012.

Basic principles of the iterative Fourier transform algorithm (IFTA) are found in the specialist article "Further improvements to the ptychographical iterative engine" by A. Maiden et al., OPTICA, Vol. 4, No. 7, 2017 and "Movable Aperture Lensless Transmission Microscopy: A Novel Phase Retrieval Algorithm" by H. M. L. Faulkner et al., Phys. Rev. Lett., Vol. 93, No. 2, 2004.

A further reference for the use of a diffractive image recording in structure detection is the specialist article "Full field tabletop EUV coherent diffractive imaging in a transmission geometry" by B. Zhang et al., Optics Express, Vol. 21, No. 19, 2013.

Simulation methods which can be used in this context are moreover known from the dissertation "Photolithography Simulation" by Heinrich Kirchauer, T U Vienna, March 1998.

What is claimed is:

1. A method for ascertaining an image of an object emerging when the object is illuminated with illumination light from a partly coherent light source with a target illumination setting having a simulated illumination-side numerical aperture NA_illu and a simulated imaging-side numerical aperture NA_detection, including the following steps:

illuminating a section of the object with illumination light from a coherent measurement light source with an illumination setting having an illumination-side numerical aperture NA_i, which is at least as large as the simulated NA_detection, recording a diffraction image of the illuminated section by way of a spatially resolved detection in a far field detection plane of a diffraction intensity of illumination light diffracted by the illuminated section with a recording-side numerical aperture NA, which is greater than or equal to the simulated NA_illu and greater than the simulated NA_detection, by way of a plurality of sensor pixels, and ascertaining the image of the section of the object for the target illumination setting from the recorded diffraction image data.

2. The method of claim 1, wherein the ascertainment of the image includes a reconstruction of amplitude and phase of a coherent object illumination light field ($\psi$) spatially downstream of the section of the object using the recorded diffraction image data, wherein the object illumination light field ($\psi$) would arise in the case of an illumination of the section of the object with illumination light in the form of a plane wave.

3. The method of claim 2, wherein a simulation is carried out when ascertaining the image, said simulation arising from a virtual illumination of the object diffraction field ($\psi$) in an object plane using a diffraction-limited illumination spot (F).

4. The method of claim 3, wherein the following steps are carried out in the simulation:

simulating aerial image data of an object point by way of a virtual illumination of the object diffraction light field ($\psi$) in the object plane using a diffraction-limited illumination spot (F) with a simulated numerical aperture NA, which at most is as large as the illumination-side numerical aperture NA_i, summing the pixel data which have arisen by way of the simulation for the object section to be detected, for the pixels whose arrangement corresponds to the illumination directions of the illumination setting, scanning the object diffraction field within the section of the object using the illumination spot (F) and repeating the steps of "simulating" and "summing" for each grid point.

5. The method of claim 3, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

6. The method of claim 5, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

7. The method of claim 1, wherein a simulation is carried out when ascertaining the image, said simulation arising from a virtual illumination of the object diffraction field ($\psi$) in an object plane using a diffraction-limited illumination spot (F).

8. The method of claim 7, wherein the following steps are carried out in the simulation:

simulating aerial image data of an object point by way of a virtual illumination of the object diffraction light field ($\psi$) in the object plane using a diffraction-limited illumination spot (F) with a simulated numerical aperture NA, which at most is as large as the illumination-side numerical aperture NA_i, summing the pixel data which have arisen by way of the simulation for the object section to be detected, for the pixels whose arrangement corresponds to the illumination directions of the illumination setting, and

scanning the object diffraction field within the section of the object using the illumination spot (F) and repeating the steps of "simulating" and "summing" for each grid point.

9. The method of claim 8, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

10. The method of claim 7, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

11. An apparatus for carrying out a method for ascertaining an image of an object when the object is illuminated with illumination light from a partly coherent light source with a target illumination setting having a simulated illumination-side numerical aperture NA_illu and a simulated imaging-side numerical aperture NA_detection, comprising a coherent measurement light source configured to provide illumination light for illuminating a section of the object with an illumination setting having an illumination-side numerical aperture NA_i, which is at least as large as the simulated NA_detection, comprising a spatially resolving detector, arranged in the detection plane, for recording the diffraction image of the illuminated section by way of a spatially resolved detection in a far field detection plane of a diffraction intensity of illumination light diffracted by the illuminated section with a recording-side numerical aperture NA, which is greater than or equal to the simulated NA_illu and greater than the simulated NA_detection, by way of a plurality of sensor pixels of the spatially resolving detector, and comprising a digital signal processor configured to ascertain the image of the section of the object for the target illumination setting from the recorded diffraction image data.

12. The apparatus of claim 11, comprising an aperture stop for specifying the illumination-side numerical aperture NA_i as selection from a plurality of specifiable illumination-side numerical apertures.

13. The apparatus of claim 11, wherein the ascertainment of the image includes a reconstruction of amplitude and phase of a coherent object illumination light field ($\psi$) spatially downstream of the section of the object using the recorded diffraction image data, wherein the object illumination light field ($\psi$) would arise in the case of an illumination of the section of the object with illumination light in the form of a plane wave.

14. The apparatus of claim 13, wherein a simulation is carried out when ascertaining the image, said simulation arising from a virtual illumination of the object diffraction field ($\psi$) in an object plane using a diffraction-limited illumination spot (F).

15. The apparatus of claim 13, comprising an aperture stop for specifying the illumination-side numerical aperture NA_i as selection from a plurality of specifiable illumination-side numerical apertures.

16. The apparatus of claim 11, wherein a simulation is carried out when ascertaining the image, said simulation arising from a virtual illumination of the object diffraction field ($\psi$) in an object plane using a diffraction-limited illumination spot (F).

17. The apparatus of claim 16, wherein the following steps are carried out in the simulation:

simulating aerial image data of an object point by way of a virtual illumination of the object diffraction light field ($\psi$) in the object plane using a diffraction-limited illumination spot (F) with a simulated numerical aperture NA, which at most is as large as the illumination-side numerical aperture NA_i, summing the pixel data which have arisen by way of the simulation for the object section to be detected, for the pixels whose arrangement corresponds to the illumination directions of the illumination setting, scanning the object diffraction field within the section of the object using the illumination spot (F) and repeating the steps of "simulating" and "summing" for each grid point.

18. The apparatus of claim 17, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

19. The apparatus of claim 16, wherein the field of the diffraction-limited illumination spot (F) is multiplied by the reconstructed object illumination light field ($\psi$) during the simulation and in that the multiplication result is Fourier transformed, as a result of which aerial image data of the object point in the far field arise.

20. The apparatus of claim 16, comprising an aperture stop for specifying the illumination-side numerical aperture NA_i as selection from a plurality of specifiable illumination-side numerical apertures.

*　*　*　*　*